United States Patent [19]

Namiki et al.

[11] Patent Number: 5,004,668

[45] Date of Patent: Apr. 2, 1991

[54] IMAGE-RECEIVING SHEET MATERIAL AND PROCESS FOR THE FORMATION OF TRANSFERRED IMAGE

[75] Inventors: Tomizo Namiki; Tamotsu Suzuki; Masashi Katayama, all of Shizuoka, Japan

[73] Assignee: Fuji Photo Film Co., Ltd., Kanagawa, Japan

[21] Appl. No.: 494,295

[22] Filed: Mar. 16, 1990

[30] Foreign Application Priority Data

Mar. 17, 1989 [JP] Japan .................................. 1-65067

[51] Int. Cl.[5] ...................... G03C 1/90; G03C 11/12; B32B 27/32; C09J 7/02

[52] U.S. Cl. .................................. 430/256; 430/257; 430/259; 430/263; 430/950; 428/339; 428/352; 428/521

[58] Field of Search .............. 430/256, 257, 259, 263, 430/950; 428/339, 352, 521

[56] References Cited

U.S. PATENT DOCUMENTS

| | | | |
|---|---|---|---|
| 3,721,557 | 3/1973 | Inoue | 430/257 |
| 4,482,625 | 11/1984 | Namiki et al. | 430/257 |
| 4,766,053 | 8/1988 | Shinozaki et al. | 430/257 |
| 4,877,712 | 10/1989 | Namiki et al. | 430/257 |

*Primary Examiner*—Richard L. Schilling
*Attorney, Agent, or Firm*—Sughrue, Mion, Zinn Macpeak & Seas

[57] ABSTRACT

An image-receiving sheet material which is used in a transfer image-formation process comprising: (A) transferring an image formed on an image-forming layer of a transferable and light-sensitive material onto an image-receiving sheet material, and then (B) retransferring the image from the image-receiving sheet material onto a permanent support, wherein the image-receiving sheet material comprises: (1) a support, and (2) provided thereon an image-receiving layer which comprises at least two layers each comprising a composition containing an organic high polymer, wherein at least one of at least two layers of the image-receiving layer is to be transferred onto the permanent support and which contains a matting agent comprising a composite three-dimensional resin particles prepared by a process comprising at least: (a) emulsion-polymerizing a polyfunctional monomer having at least two unsaturated groups differing in copolymerizability from each other with a polymerizable monomer containing a cross-linkable monomer capable of reacting with one of the at least two unsaturated groups of the polyfunctional monomer to obtain three-dimensional resin particles in which another of the at least two unsaturated groups of the polyfunctional monomer remains, and (b) forming a substantially linear polymer chain by graft-polymerizing a radical-polymerizable monomer containing at least one polymerizable group monomer capable of reacting with the another of the at least two unsaturated groups of the polyfunctional monomer; and a process for the formation of transferred image using the image-receiving sheet material are disclosed.

8 Claims, No Drawings

IMAGE-RECEIVING SHEET MATERIAL AND PROCESS FOR THE FORMATION OF TRANSFERRED IMAGE

FIELD OF THE INVENTION

This invention relates to an image-receiving sheet material comprising a transfer layer which is mainly applied to a color proof for color correction or display.

BACKGROUND OF THE INVENTION

There are known methods comprising subjecting a photosensitive laminate, wherein a peel layer comprising an organic polymer and a light-sensitive resin layer are located on a provisional support, to exposure and development so as to form an image on the peel layer and then transferring the image onto an arbitrary support. These methods are described in, for example, JP-B-46-15326 and JP-B-49-441 (corresponding U.S. Pat. No. 3,721,557). (The term "JP-B" as used herein means an "examined Japanese patent publication".) These methods are advantageous in that they are applicable not only over lay type processes but also to surprint type processes as a color proof. However they have some disadvantages in that it is required to use an adhesive upon each transfer, which makes the procedure troublesome, and the accuracy of site matching upon the transfer of each color is low.

In order to avoid this troublesome procedure, JP-A-47-41830, JP-A-48-93337 and JP-A-51-5101 each disclose a method where an image, which has been formed on an image-receiving sheet, is transferred by applying heat and pressure to the image-forming sheet. (The term "JP-A" as used herein means an "unexamined published Japanese patent application".) JP-A-51-5101, in particular, discloses a method comprising locating a heat-fusible polymer layer as an adhesive on a permanent support, while JP-A-47-41830 discloses a method whereby an image is directly transferred to a permanent support such as art paper or coated paper.

However these methods have the following disadvantages. One of the disadvantages resides in that the final image thus obtained is in the reverse right and left of its original. Further, the use of the heat-fusible polymer having a high melting point elevates the transfer temperature. As a result, the dimensional stability of the support is lowered, which causes a deviation in site matching of the transfer of each color. On the other hand, the use of a polymer having a low melting point frequently causes adhesion or scratches after the formation of an image. JP-A-59-97140 (corresponding to U.S. Pat. No. 4,482,625) discloses a method for improving these disadvantages.

In this method, an image of each color is once transferred onto a provisional image-receiving sheet provided with a photopolymerizable image-receiving layer prior to the transfer of the image of each color onto a permanent support. Next, the image is retransferred onto the permanent support and subjected to overall exposure to thereby solidify the photopolymerizable image-receiving layer.

This method is highly effective in solving the above-mentioned problems. Namely, it makes it possible to give a positive image of the mask original. Since an ethylenic polyfunctional monomer is used in this method, furthermore, the photopolymerizable image-receiving layer per se is soft at the transfer and makes it possible to conduct the transfer at a low temperature. Subsequently, the photopolymerizable image-receiving layer is solidified through exposure. Thus the layer has a high resistance against adhesion and scratches.

JP-A-61-189535 (corresponding to U.S. Pat. No. 4,766,053) discloses an image-receiving sheet having a two-layer image-receiving layer comprising organic polymers located on a support. By using this image-receiving sheet upon the transfer of an image onto a permanent support, it may be arbitrarily selected either to transfer the second receiving layer onto the image layer or to transfer the image layer alone, by appropriately controlling the peeling between the receiving layers and that between the second layer and the image layer.

However each of these methods has some disadvantages such as bubbles form at the transfer and damage the image or the final product thus obtained shows adhesion when stored at a high temperature or high humidity.

SUMMARY OF THE INVENTION

An object of the present invention is to provide an image-receiving sheet material and a process for the formation of transferred image which are free from the above-mentioned problems.

The object of the present invention has been achieved by providing an image-receiving sheet material which is used in a transfer image-formation process comprising: (A) transferring an image formed on an image-forming layer of a transferable and light-sensitive material onto an image-receiving sheet material, and then (B) retransferring said image from said image-receiving sheet material onto a permanent support, wherein said image-receiving sheet material comprises: (1) a support, and (2) provided thereon an image-receiving layer which comprises at least two layers each comprising a composition containing an organic high polymer, wherein at least one of at least two layers of said image-receiving layer is to be transferred onto the permanent support and which contains a matting agent comprising a composite three-dimensional resin particles prepared by a process comprising at least: (a) emulsion-polymerizing a polyfunctional monomer having at least two unsaturated groups differing in copolymerizability from each other with a polymerizable monomer containing a cross-linkable monomer capable of reacting with one of the at least two unsaturated groups of said polyfunctional monomer to obtain three-dimensional resin particles in which another of the at least two unsaturated groups of the polyfunctional monomer remains, and (b) forming a substantially linear polymer chain by graft-polymerizing at least one radical-polymerizable monomer capable of reacting with the another of the at least two unsaturated groups of the polyfunctional monomer. Also provided is a process for the formation of a transfer image which comprises transferring an image formed on a transferable and light-sensitive material onto an image-receiving sheet and then retransferring the image onto a permanent support.

As the above-mentioned matting agent, silica particles or core-shell type organic high polymer particles having a particle size of about 0.005 to 20 μm may be preferably employed.

DETAILED DESCRIPTION OF THE INVENTION

The support of the image-receiving sheet is preferably made of a flexible material stable to heat and chemicals. More particularly, a thin sheet of, for example, polyethylene terephthalate or polycarbonate may be preferably employed therefor. It is sometimes possible to use a paper on which a polyethylene film is laminated. It is further possible to subject the support to a surface treatment such as a corona treatment, glow treatment, surface matting or UV irradiation or to form an undercoat layer so as to enhance the adhesivity of the support to the layer located thereabove.

The organic high polymer to be used as the first layer may be preferably selected from among those having a softening point, determined by Vicat's method (ASTM (American Society for Testing and Materials) D 1235: Determination of softening point of polymer), of about 80° C. or below. This is because the use of a polymer having a low softening point as the first layer makes the surface thereof possible to be transformed in accordance with unevenness on the surface of the permanent support to improve the adhesion between the second layer of an image-receiving sheet material, on which a transferable image has been transferred, and a permanent support such as a paper to which the image is to be transferred by applying heat and pressure. In this case, furthermore, no matting step is required upon peeling and the image thus obtained is highly approximate to a printed one, since both of the permanent support and the second layer is not transformed by applying pressure. When a polymer of a high softening point is used, on the other hand, the transfer should be conducted at a high temperature, which would seriously lower, for example, the dimensional stability of the image. When a polyethylene terephthalate film is to be used as a support for a light-sensitive material or an image-receiving sheet material, therefore, the organic high polymer should be selected from among organic high polymers having a softening point of about 80° C. or below, preferably about 60° C. or below and still more preferably about 50° C. or below. Examples of organic high polymers having a softening point of 80° C. or below include polyolefins such as polyethylene and polypropylene; ethylene copolymers such as ethylene/vinyl acetate and ethylene/acrylate copolymers; polyvinyl chloride; vinyl chloride copolymers such as vinyl chloride/vinyl acetate copolymers; styrene; polystyrene copolymers such as styrene/(meth)acrylate copolymers; polyvinyltoluene; vinyltoluene copolymers such as vinyltoluene/(meth)acrylate copolymers; poly(meth)acrylate; (meth)acrylate copolymers such as butyl (meth)acrylate/vinyl acetate copolymers; vinyl acetate copolymers; polyamide resins such as nylon, copolymer nylon and N-alkoxymethylated nylon; synthetic rubbers; and chlorinated rubbers. These organic high polymers can be used either alone or a mixture of two or more of them. Furthermore, organic high polymers having a softening point of about 80° C. or below described in *Plastics Seino Binran* (Plastic Performance Handbook), educated by The Japan Plastics Industry Federation, published by Kogyo Chosa-kai, published on Oct. 25, 1968, may be used therefor. It is also possible to add various plasticizers compatible with these organic high polymers so as to substantially lower the softening point thereof. It is further possible to add compatible plasticizer(s) to an organic high polymer having a softening point of above 80° C. so as to substantially reduce the softening point thereof to about 80° C. or below. It is furthermore possible to add various polymers, supercooling materials, adhesion improvers, surfactants and/or mold release agents to these organic high polymers to thereby control the adhesivity thereof, so long as the substantial softening point thereof does not exceed 80° C. When a vinyl acetate/ethylene copolymer is used as the first layer on a polyethylene terephthalate film, for example, it is particularly effective to add a trace amount of chlorinated polyethylene thereto. The thickness of the organic high polymer employed as the first layer may preferably range from about 1 to 50 μm, still more preferably from about 5 to 30 μm.

One of the reasons therefor resides in that the thickness of the first layer should exceed that of the unevenness on the surface of the permanent support, when an image transferred onto the image-receiving sheet material is to be retransferred onto the permanent support. Another reason therefor is that the first layer is preferably 4 times as thick as the unevenness in the streaked part and unstreaked part of each color upon the transfer of a transferable image showing uneven streaked parts and unstreaked parts onto the image-receiving sheet material, particularly in the case where four colors overlap each other as observed in color proofs, though a thin first layer may be used in the case of monochrome transfer.

The objects of the formation of the second organic high polymer layer on the above-mentioned first organic high polymer layer having a softening point, determined by Vicat's method, of substantially 80° C. or below are as follows. First, the first organic high polymer layer generally having a low softening point would be sticky or have a poor workability. Alternately, it is commonly observed that the excessively high adhesivity of the first organic high polymer layer to a permanent support such as paper causes some problems such as paper-peeling, when these materials come directly into contact with each other at the transfer of a transferable image, which has been transferred onto the image-receiving sheet material, onto the permanent support. Therefore it is required to prevent these problems by forming the second layer.

Various materials are available as the organic high polymer to be used in the second layer. It should be appropriately selected depending on the material of the image-forming part as well as the material of the permanent support, while considering the material to be used as the first layer.

Particular examples of the organic high polymer to be used as the second layer may be selected from among polyolefins such as polyethylene and polypropylene; ethylene copolymers such as ethylene/vinyl acetate, ethylene/acrylate and ethylene/acrylic acid copolymers; polyvinyl chloride; vinyl chloride copolymers such as vinyl chloride/vinyl acetate copolymers; polyvinylidene chloride; vinylidene chloride copolymer; polystyrene; styrene copolymers such as styrene/maleate copolymers; polyacrylate; acrylate copolymers such as acrylate/vinyl acetate copolymers; polymethacrylate; methacrylate copolymers such as alkyl methacrylate/vinyl acetate copolymers; vinyl acetate copolymers; butylal resin; gelatin; modified polyvinyl alcohol; polyamide resins such as nylon, copolymer nylon and N-alkoxymethylated nylon; synthetic rubbers; chlorinated rubbers; and cellulose derivatives. These organic high polymer can be used either alone or a mixture of two or more of them as the second layer.

It is further possible to add commonly known adhesion improvers, fluorine or silicone mold release agents as well as surfactants, plasticizers and supercooling agents so as to control the adhesivity of these resins with the first layer, the image-forming layer, the permanent support and so on.

The thickness of the second layer may preferably range from about 0.1 to 10 μm, still more preferably from about 0.5 to 3 μm.

When the softening point of the organic high polymer employed as the second layer is higher than the transfer temperature, an excessively large thickness thereof might make it impossible to embed it along with the unevenness on the surface of the permanent support. As a result, the adhesion is deteriorated or the printing approximation is lowered.

Examples of the material for the permanent support include art paper, coated paper, wood-free paper, pulp paper, AL board, synthetic film, cloth and can material.

An image-receiving layer comprising three or more layers should be designed in such a manner that two or more of these layers are to be transferred onto the permanent support. In this case, the top layer would improve the adhesivity to the image and prevent the formation of bubbles, while the one located therebelow would prevent the adhesion of the final product. Thus the functions of the image-receiving layer can be different, which makes it easy to select each material In the above-mentioned case, the matting agent may be contained in either layers to be transferred onto the permanent support. In order to fully achieve the objects of the present invention, however, it is preferable that the matting agent is contained at least in the top layer of the image-receiving sheet material and in the top layer of the final product.

The process and the technique which can be employed for preparation of the image-receiving sheet material of the present invention are known and described, for example, in U.S. Pat. Nos. 4,482,625 and 4,766,053.

Various methods described in the patents cited above may be employed for the formation of the transferable image to be used in the present invention.

Among them, the one wherein a peel layer is placed on a support and a color-material containing layer using a light-sensitive resin is further located thereon is particularly preferable. When there is no peel layer, the image per se should be thermally transferred onto the permanent support. As a number of tests indicate, the range for selecting the material is considerably restricted and/or a high thermal transfer temperature should be employed in this case. When a peel layer is formed, on the other hand, the functions may be easily divided and thus these problems may be solved. When a photographic image is formed, a color image may be formed on the peel layer without etching the peel layer in the unstreaked part upon development.

Now the matting agent to be used in the present invention will be described.

As the matting agent to be used in the present invention, various materials having a particle size of 0.005 to 20 μm may be selected. Inorganic materials such as silica as well as organic high polymers may be used as the matting agent. A preferable organic matting agent is a so-called core-shell type one wherein the composition of each particle is not uniform and the composition of the internal layer (core) differs from that of the external layer (shell) That is to say, the matting agent comprises an internal layer (core) made of a material having a high softening point such as polystyrene or polymethyl methacrylate and/or a polymer having a three-dimensional structure and an external layer (shell) made of a polymer prepared from monomer(s) capable of forming soft component(s) upon polymerization, for example, diene polymers, methyl acrylate or ethyl acrylate Further, the polymer to be used in the shell may be obtained by copolymerizing monomer(s) having functional group(s) such as hydroxyl, amino or carboxyl groups so as to improve the adhesivity.

Such a matting agent may be prepared according to a method described in, for example, JP-A-60-255827, JP-A-61-4761 (corresponding to U.S. Pat. No. 4,777,213), JP-A-61-223015 (corresponding to U.S. Pat. No. 4,829,127), JP-A-62-27410 (corresponding to U.S. Pat. No. 4,803,252), JP-A-62-84113 (corresponding to U.S. Pat. No. 4,820,777), JP-A-62-119271 (U.S. Pat. No. 4,842,936), JP-A-62-149761 (U.S. Pat. No. 4,777,199), JP-A-62-167306, JP-A-62-167366, JP-A-62-167367, JP-A-62-246916 (corresponding to U.S. Pat. No. 4,833,208), JP-A-62-246917 (U.S. Pat. No. 4,833,189), JP-A-62-283162 or JP-A-63-171637 (U.S. Pat. No. 4,788,246).

Although the ratio of the core (a radius of the core)/the shell (a thickness of the shell) in the matting agent to be used in the present invention is not particularly limited, it is generally from 9/1 to 1/9 and preferably from 5/5 to 2/8).

The amount of the matting agent to be used in the image-receiving layer of the image-receiving sheet material of the present invention is generally from 0.01 to 20% by weight based on the total weight of the layer of which the matting agent is incorporated. However, a preferred amount or a preferred particle size of the matting agent can be selected in accordance with the film thickness of the second layer.

The softening point of the external layer (shell) of the matting agent to be used in the present invention is from about −10° to 110° C., preferably form about 0° to 90° C.

It is preferable that the matting agent to be used in the present invention comprises an internal (core) organic high polymer having a softening point of about 20° C. or above and that of the external layer (shell) is about 100° C. or below and the softening point of the internal layer is higher than that of the external layer at least by about 10° C.

It is believed that hard polymer contained as the core of such a matting agent would prevent the formation of bubble while soft polymer of the shell of the same would improve the adhesivity.

Now the composite (core-shell type) three-dimensional resin particles which can be particularly preferably used as the matting agent of the present invention will be described in detail. The core of these particles are polymer particles made of, for example, a condensation resin such as a polyester, an epoxy or an amino resin or a polymer resin such as an acryl or a vinyl resin which have a three-dimensional structure and a particle size of about 0.005 to 20 μm, preferably about 0.01 to 10 μm. These composite three-dimensional resin polymer particles may be readily produced by adding or introducing addition-polymerizable unsaturated group(s) onto the surface of each particle during or after the production of the particle and then addition-polymerizing addition-polymerizable ethylene compound(s) to thereby form a linear polymer.

Alternately, it is possible that polymer particles having a three-dimensional structure carry appropriate functional group(s) with which reactive derivative(s) of other linear polymers are reacted so as to chemically bind the linear polymer to the particles. Therefore both of the core of the composite particles and the linear polymer may be made of any appropriate resins. Further, the methods for the production of these resins may be appropriately selected by those skilled in the art.

In the present invention, however, both of the core particles and the linear polymer of the composite three-dimensional resin particles are preferably selected from among polymer resins such as acryl, from the viewpoint of ease of production.

In a particularly preferred embodiment of the present invention, the above-mentioned composite three-dimensional resin particles may be advantageously produced in the following manner. Namely, a polyfunctional monomer having at least two unsaturated groups differing in copolymerizability from each other is emulsion-polymerized with polymerizable monomers containing a cross-linkable monomer capable of reacting with one of the unsaturated groups of the polyfunctional monomer. Thus three-dimensional resin particles in which another unsaturated group of the polyfunctional monomer remains is produced. Next, a polymerizable monomer capable of reacting with the remaining unsaturated group is added optionally together with other polymerizable monomer(s) thereto so as to conduct graft polymerization. Thus a substantially linear polymer chain is obtained The expression "unsaturated groups differing in copolymerizability from each other" as used herein means an unsaturated bond having a selectivity for the monomer to be copolymerized therewith and one having no selectivity therefor; one having homopolymerizability and one having no homopolymerizability; or those differing in reactivity from each other, as typically exemplified by, for example, a monosubstituted or a 1,1-disubstituted ethylene bond and a 1,2-disubstituted or polysubstituted ethylene bond. In the present invention, polyfunctional monomers having two or more of such unsaturated groups differing in copolymerizability from each other as defined above are advantageously employed in the synthesis of composite three-dimensional resin particles. Particularly preferable examples of the polyfunctional monomer include allyl (meth)acrylate, an adduct of allyl glycidyl ether and (meth)acrylic acid, an adduct of monoallylamine or diallylamine and glycidyl (meth)acrylate or isocyanate having a (meth)acryloyl group, an adduct of allyl alcohol and isocyanate having a (meth)acryloyl group, an adduct of maleic acid or fumaric acid and glycidyl (meth)acrylate, an adduct of monomaleate or monofumarate and glycidyl (meth)acrylate and an adduct of a fatty acid having an unsaturated group and glycidyl (meth)acrylate. Unsaturated groups contained in the acryloyl or methacryloyl portions of these compounds have no selectivity for the monomer to be copolymerized with. Thus they would react with any polymerizable monomer. On the other hand, allyl group, maleic acid-type double bonds and double bonds in unsaturated fatty acids portions of these compounds would selectively react with polymerizable aromatic compounds. Thus it is advantageous to use the former ones in the synthesis of the three-dimensional core of the composite particles and to use the latter ones in the synthesis of the linear polymer.

The above-mentioned polyfunctional monomer may be emulsion-polymerized with monomers containing a cross-linkable monomer and monomer having another $\alpha,\beta$-ethylenic unsaturated bond, to thereby give three-dimensional resin particles. Advantageous examples of the cross-linkable monomer to be used therefor include a combination of a compound having one or more $\alpha,\beta$-ethylenic unsaturated bonds with a compound having two or more radical-polymerizable ethylenic unsaturated groups such as a polymerizable unsaturated monocarboxylate of a polyhydric alcohol or a polymerizable unsaturated alcohol ester of a polybasic acid, or with a compound having functional groups capable of reacting with each other; such as (meth)acrylic acid with glycidyl (meth)acrylate; hydroxy(meth)acrylate with isocyanate (meth)acrylate (blocked); a radical-polymerizable silane coupling agent such as vinyltrialkoxysilane and (meth)acryloxyalkyltrialkoxysilane. Furthermore, any monomer available in the synthesis of an acryl resin may be used as another monomer having $\alpha,\beta$-ethylenic unsaturated bond. However polymerizable aromatic compounds showing a selective reactivity with the remaining 1,2-disubstituted double bond should be excluded.

The monomers which can be used for synthesis of the composite three-dimensional resin particles may be roughly classified as follows.

(I) Carboxyl group-containing monomers such as acrylic acid, methacrylic acid, crotonic acid, itaconic acid, maleic acid and fumaric acid.

(II) Hydroxyl group-containing monomers such as 2-hydroxyethyl acrylate, hydroxypropyl acrylate, 2-hydroxyethylmethacrylate, hydroxypropyl methacrylate, hydroxybutylacrylate, hydroxybutyl methacrylate, allyl alcohol and methallyl alcohol.

(III) Nitrogen-containing alkyl acrylate or methacrylate such as dimethylaminoethyl acrylate and dimethylaminoethyl methacrylate.

(IV) Polymerizable amides such as acrylamide and methacrylamide.

(V) Polymerizable nitriles such as acrylonitrile and methacrylonitrile.

(VI) Alkyl acrylates or methacrylates such as methyl acrylate, methyl methacrylate, ethyl acrylate, n-butyl acrylate, n-butyl methacrylate and 2-ethylhexyl acrylate.

(VII) Glycidyl (meth)acrylate.

(VIII) $\alpha$-Olefins such as ethylene and propylene.

(IX) Vinyl compounds such as vinyl acetate and vinyl propionate.

(X) Diene compounds such as butadiene and isoprene.

(XI) Compounds obtained by reacting the above-mentioned monomers with compounds having functional groups capable of reacting therewith, such as a monomer product obtained by reacting a hydroxyl group-containing monomer (II) with an isocyanate compound; and a monomer product obtained by reacting a carboxyl group-containing monomer (I) with a glycidyl group-containing compound.

One of these monomers may be used alone. Alternately, a mixture thereof may be used.

Upon the emulsion polymerization, commonly used polymerization initiator(s) and emulsifier(s) may be used so as to form the desired core particles in a conventional manner. It is particularly preferable to use a resin having a group of the formula:

$$-\overset{|}{N}^{+}-R-Y^{-}$$

wherein R represents a $C_1$ to $C_6$ alkylene or phenylene group; and

Y represents a —COO or $SO_3$ group; in a molecule, as the one described in J-A-58-129066, as an emulsifier.

Next, a polymerizable aromatic compound such as styrene, α-methylstyrene, vinyltoluene or t-butylstyrene is added, optionally together with the above-mentioned monomer(s), to the reaction mixture containing the core resin particles thus obtained. Then a substantially linear polymer chain is obtained by graft polymerization.

According to this method, composite three-dimensional resin particles having the core particles to which the substantially linear polymer is chemically bonded are obtained. Since the radical-polymerizable monomer to be used in the formation of the linear polymer chain is never restricted, the linear polymer chain may be freely designed. Namely, composite three-dimensional resin particles which have a polymer chain carrying a carboxyl or an amino group may be obtained by adding a monomer (I) or (III) to some portion thereof. Furthermore, a novel function such as a hardening catalytic function, a reactivity with an epoxy compound or an anion or cation-electrodeposition capability may be added thereto. Further, composite three-dimensional resin particles having a hydroxyl group-containing polymer chain may be obtained by adding a monomer (II) thereto. In this case, therefore, a crosslinked continuous phase may be obtained by reacting the obtained composite three-dimensional resin particles with, for example, a melamine resin or an isocyanate compound.

Composite three-dimensional resin particles having a polymer chain of a high crystallinity may be obtained by adding a monomer (IV), a product of an addition reaction of a hydroxyl group-containing monomer with a monoisocyanate compound or a monomer product obtained by addition reaction of an isocyanate group-containing monomer with a monoamine compound. Thus a structural viscosity or a function of rheological controlling may be imparted thereby. In addition, a functional group can be introduced into the linear polymer so as to employ it as a reactive group or to use the characteristics of the functional group as such. As a matter of course, it is possible to select desired monomer(s) from among a number of monomers to thereby fully utilize the characteristics of these monomers.

In order to help understand the present invention, a method for synthesizing the core particles and the linear polymer via a two-stage reaction with the use of a polyfunctional monomer having two unsaturated groups differing in copolymerizability from each other is described above It is easily understood, however, that a polyfunctional monomer having more than two unsaturated groups differing in copolymerizability from each other can also be used and that the reaction may be conducted via more than two stages wherein, for example, linear polymer chains are partially produced and then crosslinkable chains are synthesized followed by forming linear polymer chains again.

To further illustrate the present invention, and not by way of limitation, the following Examples are given.

Unless otherwise indicated, all percents, ratios, parts, etc. are by weight.

EXAMPLE 1

A transferable image was formed in the following manner.

First, a solution of the following composition was prepared to thereby give a coating solution for the formation of a peel layer.

Coating Solution for Peel Layer

| | |
|---|---|
| Alcohol-soluble polyamide (CM-8000, "η" 20° C., in 10% by weight methanol solution = 23 cps, mfd. by Toray Industries, Inc.) | 7.2 g |
| Polyhydroxystyrene (Resin M, average molecular weight: 5500, mfd. by Maruzen Oil Co., Ltd.) | 1.8 g |
| Methanol | 400 g |
| Methyl cellosolve | 100 g |

This coating solution was uniformly applied onto a polyethylene terephthalate film (support thickness: 100 μm) and dried to thereby give a peel layer of 0.5 μm in film thickness.

Next, four light-sensitive solutions of yellow (Y), magenta (M), cyan (C) and black (B), each having the composition specified in Table 1, were prepared as coating solutions for the formation of light-sensitive resin layers in order to form a negative (N) to positive (P) type image.

TABLE 1

| | Y (g) | M (g) | C (g) | B (g) |
|---|---|---|---|---|
| Benzyl methacrylate/methacrylic acid copolymer (molar ratio: 73/27, viscosity $\eta^{(1)}$: 0.12) | 60 | 60 | 60 | 60 |
| pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)-4,5-diphenyl imidazole dimer | 2.5 | 2.5 | 2.5 | 2.5 |
| Seika First Yellow H-0755 (mfd. by Dainippon Seika Kogyo K.K.) | 9.4 | — | — | — |
| Seika First Carmine 1483 (mfd. by Dainippon Seika Kogyo K.K.) | — | 5.2 | — | — |
| Cyanine Blue 4820 (mfd. by Dainippon Seika Kogyo K.K.) | — | — | 5.6 | — |
| Mitsubishi Carbon Black KA-100 (mfd. by Mitsubishi Chemical Industries, Ltd.) | — | — | — | 6.6 |
| Methyl cellosolve acetate | 560 | 560 | 560 | 560 |
| Methyl ethyl ketone | 280 | 280 | 280 | 280 |

Note
(1) The intrinsic viscosity in a methyl ethyl ketone solution at 25° C.

Each of these four light-sensitive solutions was applied to the support carrying the above-mentioned peel layer and dried to thereby give a light-sensitive resin layer of 2.4 μm in dry film thickness.

Separately, a coating solution of the following composition was prepared for the formation of a protective layer. The coating solution thus obtained was applied onto the light-sensitive resin layer of each color to thereby give a protective layer of 1.5 μm in dry film thickness.

Coating Solution for Protective Layer

| | |
|---|---|
| Polyvinyl alcohol | 60 g |

-continued

| | |
|---|---|
| (GL-05, mfd. by Nippon Gosei Kagaku Kogyo K.K.) | |
| Water | 970 g |
| Methanol | 30 g |

Thus light-sensitive transfer sheets (negative colored light-sensitive sheets) of the four colors, each comprising a support, a peel layer, a light-sensitive resin layer and a protective layer in this order, were prepared.

Each of these light-sensitive transfer sheets was placed on the corresponding mask with register pins and exposed to an ultra-high pressure mercury lamp (2 kW) placed 50 cm apart. The transfer sheet thus exposed was then developed with the use of a developing solution of the following composition at 35° C. for 10 to 20 seconds. Thus four color proofing sheets each having a halftone dot image on the peel layer were obtained.

Developing Solution

| | |
|---|---|
| $Na_2CO_3$ | 15 g |
| Butyl cellosolve | 1 g |
| Water | 1 l |

On the other hand, a image-receiving sheet material was prepared in the following manner. Coating solutions A and B of the following compositions were successively applied on a polyethylene terephthalate film (thickness: 100 μm) to thereby give a two-layer image-receiving sheet material showing a dry film thicknesses of 20 μm and 1.5 μm respectively.

Coating Solution A

| | |
|---|---|
| Ethylene/vinyl acetate copolymer (weight ratio: ethylene/vinyl acetate = 81/19, "EVAFLEX #410" mfd. by Mitsui Polychemical Co., Ltd.) | 15 g |
| Chlorinated polyethylene ("Superchlone 907LTA" mfd. by Sanyo-Kokusaku Pulp Co., Ltd.) | 0.075 g |
| Fluorine surfactant ("FLUORAD FC-430", mfd. by 3M Co.) | 0.25 g |
| Toluene | 100 cc. |

Coating Solution B

| | |
|---|---|
| Polyvinyl butylal ("#2000-L", mfd. by Denki Kagaku Kogyo K.K.) | 4 g |
| Fluorine surfactant ("FLUORAD FC-430" mfd. by 3M Co.) | 0.05 g |
| Matting agent (core: polymethyl methacrylate; softening point: 80 to 125° C. shell: methyl acrylate/acrylic acid/divinyl benzene copolymer (96.5/3/0.5), softening point: 0 to −25° C., weight ratio of core to shell: 7/3, particle size = 20 μm) | 0.1 g |
| Methanol | 50 cc |
| Methyl ethyl ketone | 20 cc |
| Methyl cellosolve acetate | 20 cc |

Next, the black color proofing sheet was exactly placed upon the image-receiving sheet with register pins in such a manner that the side of the image came in contact with the image-receiving layer of the image-receiving sheet material. Then the color proofing sheet was laminated to the image-receiving sheet by using a laminator (First Laminator 8B-550-80, mfd. by Taisei Shoji K.K.) under a pressure of 2 bar, at a roller temperature of 120° C. and at a carrying rate of 900 mm/min. The support of the color proofing sheet was peeled from the peel layer and thus the black image was transferred onto the image-receiving sheet. Subsequently the residual three color proofing sheets were treated in the same manner as the one described above. Thus an image-receiving sheet on which a half tone dot image had been transferred in the order of black, cyan, magenta and yellow, was obtained.

Next, a color test sheet for surprint was prepared by using the image-receiving sheet having the transferred image of the above four colors in the following manner.

The image-receiving sheet having the four-color transferred image was placed on a white art paper in such a manner that the image-receiving layer side came in contact with the art paper. Then the former sheet was laminated upon the latter one under the same conditions as those defined above.

Then the image-receiving sheet was peeled from the white art paper. Thus the image-receiving sheet was peeled between the second and first layers and the peel layer and the image part remained on the white art paper. When the final products were placed upon each other and stored, no adhesion trouble was observed. Furthermore, no bubbles were formed upon the transfer.

EXAMPLE 2

The four-color light-sensitive transfer sheets prepared in Example 1 were exposed in the same manner as the one described in Example 1 and then developed with a developing solution of the following composition. Simultaneously, the peel layer of the unstreaked part of each sheet was etched. Thus the half tone dot image formed on the light-sensitive transfer sheet comprised the peel layer and the photohardened photopolymerizable layer while the image formed on the unstreaked part showed an exposed polyethylene terephthalate surface.

Composition of Developing Solution

| | |
|---|---|
| NaOH | 0.3 g |
| Surfactant ("Pellex NBL" mfd. by Kao Atlas Co.) | 5 g |
| Water | 100 cc |

On the other hand, an image-receiving sheet was prepared in the following manner.

A polyethylene terephthalate film of 100 μm in thickness was prepared and coating solutions C and D, each having the following composition, were successively applied thereon to thereby give dry film thicknesses of 20 μm and 1.0 μm, respectively. Thus a two-layer image-receiving sheet material was obtained.

Coating Solution C

| | |
|---|---|
| Ethylene/vinyl acetate copolymer (weight ratio: ethylene/vinyl acetate = 81/19, "EVAFLEX #410" mfd. by Mitsui Polychemical Co., Ltd.) | 15 g |
| Chlorinated polyethylene ("Superchlone 907LTA" mfd. by Sanyo-Kokusaku Pulp Co., Ltd.) | 0.075 g |
| Fluorine surfactant | 0.25 g |

-continued

| | |
|---|---|
| ("FLUORAD FC-430" mfd. by 3M Co.) | |
| Toluene | 100 cc |

Coating Solution D

| | |
|---|---|
| Polyvinyl butylal ("#2000-L" mfd. by Denki Kagaku Kogyo K.K.) | 4 g |
| Fluorine surfactant ("FLUORAD FC-430" mfd. by 3M Co.) | 0.15 g |
| Silica particles (particle size: 2.0 μm) | 0.1 g |
| Methanol | 50 cc |
| Methyl ethyl ketone | 20 cc |
| Methyl cellosolve acetate | 20 cc |

Next, an image was transferred onto the image-receiving sheet in the same manner as the one described in Example 1. Then the image was adhered to a white art paper and the image-receiving sheet was peeled. Thus the image-receiving sheet was peeled off between the first and second layers. The image thus transferred onto the white art paper never suffered from any adhesion problems when placed on each other and stored, as described in Example 1. Further no bubbles were formed upon the transfer.

EXAMPLE 3

An image-receiving sheet was prepared in the same manner as the one described in Example 1, except that the following coating solutions E and F were employed.

Coating Solution E

| | |
|---|---|
| Vinyl chloride/vinyl acetate copolymer (weight ratio: vinyl chloride/vinyl acetate = 60/40, degree of polymerization: 300) | 15 g |
| Fluorine surfactant ("FLUORAD FC-430" mfd. by 3M Co.) | 0.25 g |
| Dibutyl phthalate | 3 g |
| Methyl ethyl ketone | 100 cc |

Coating Solution F

| | |
|---|---|
| Polyvinyl butylal ("#2000-L", mfd. by Denki Kagaku Kogyo K.K.) | 4 g |
| Fluorine surfactant ("FLUORAD FC-430" mfd. by 3M Co.) | 0.15 g |
| Matting agent (silica, particle size: 3.0 μm) | 0.1 g |
| Methanol | 60 cc |
| Methyl cellosolve | 40 cc. |

Next, an image was transferred onto the image-receiving sheet in the same manner as the one described in Example 1 and then the image was adhered to a white art paper. When peeled, the image-receiving sheet was peeled between the first and second layers. The image thus transferred onto the white art paper was as good as the one obtained in Example 1.

EXAMPLE 4

An image was transferred onto an image-receiving material in the same manner as the one described in Example 1, except that the image-receiving sheet material prepared by the following method was employed Then the image was adhered to a white art paper. When peeled, the image-receiving sheet was peeled between the first and second layers. The image thus transferred onto the white art paper was as good as the one obtained in Example 1.

Preparation of Image-Receiving Sheet Material

A polyethylene terephthalate film of 100 μm in thickness was prepared and coating solutions G, H and I, each having the following composition, were successively applied thereon to thereby give dry film thicknesses of 0.2 μm, 10 μm and 1.5 μm, respectively. Thus an image-receiving sheet material was obtained.

Coating Solution G (Undercoating for Enhancing the Adhesivity of the First Layer to the Support)

| | |
|---|---|
| Chlorinated polyethylene ("Superchlone 907LTA" mfd. by Sanyo-Kokusaku Pulp Co., Ltd.) | 2 g |
| Silicone adhesion improver ("SH-6020" mfd. by Toray Silicone K.K.) | 0.5 g |
| Toluene | 100 cc |

Coating Solution H

| | |
|---|---|
| Ethylene/vinyl acetate copolymer (weight ratio: ethylene/vinyl acetate = 81/19, "EVAFLEX #410" mfd. by Mitsui Polychemical Co., Ltd. | 10 g |
| Toluene | 40 cc |
| Cyclohexane | 60 cc. |

Coating Solution I

| | |
|---|---|
| Alcohol-soluble polyamide ("Amilan CM-4000" mfd. by Toray Industries, Inc.) | 4 g |
| Fluorine surfactant ("FLUORAD FC-430" mfd. by 3M Co.) | 0.05 g |
| Matting agent (same as the one used in Example 1) | 0.1 g |
| Methanol | 70 cc |
| Methyl cellosolve | 30 cc |

EXAMPLE 5

The procedure of Example 2 was repeated except that light-sensitive layer solutions of the compositions described in Table 2 below were prepared and each applied to give a dry film thickness of 2.4 μm.

Thus positive to positive type light-sensitive transfer sheets were obtained.

A transferable image was formed through exposure and development in the same manner as the one described in Example 2. Further, each image-receiving sheet was adhered to white art paper and then peeled off of the white art paper. Thus the image-receiving sheet was peeled between the first and second layers. The image thus transferred onto the white art paper was as good as the one obtained in Example 2.

TABLE 2

| | Yellow (g) | Magenta (g) | Cyan (g) | Black (g) |
|---|---|---|---|---|
| Adduct of condensation product of acetone and pyrogallol (average polymerization degree: 3) and 2-diazo-1-naphthol-4-sulphenyl chloride | 1.02 | 0.61 | 0.87 | 1.26 |
| Novolak phenol formalde- | 2.87 | 1.72 | 2.44 | 3.52 |

TABLE 2-continued

| | Yellow (g) | Magenta (g) | Cyan (g) | Black (g) |
|---|---|---|---|---|
| hyde resin (PR-50716 mfd. by Sumitomo-Dules Co.) | | | | |
| Abietic acid | 1.23 | 1.73 | 1.05 | 1.52 |
| Cathylon brilliant yellow 5GL | 1.064 | 0.096 | — | 1.20 |
| Rhodamine 6GCP | — | — | — | 0.54 |
| Rhodamine B | — | 0.101 | — | — |
| Safranine OK70:100 | — | 0.384 | 0.012 | — |
| Victoria pure blue | — | — | 0.57 | 0.40 |
| Erioglavcine X | — | — | 0.618 | — |
| Tricresyl phosphate | 0.51 | 0.31 | 0.44 | 0.64 |
| Fluorine surfactant (FC-430 mfd.by 3M Co.) | 0.04 | 0.04 | 0.04 | 0.04 |
| Methyl ethyl ketone | 19.0 | 19.5 | 17.0 | 18.0 |
| Methyl cellosolve acetate | 44 | 43.5 | 42.5 | 43.5 |
| Methyl cellosolve | 44 | 43.5 | 42.5 | 43.5 |

COMPARATIVE EXAMPLES 1 TO 5

Each procedure of Examples 1 to 5 was repeated except that no matting agent was employed. The obtained product was similarly evaluated. In these products, bubbles were frequently observed upon transfer. When placed on each other and stored, the final products frequently suffered from adhesion problems.

COMPARATIVE EXAMPLE 6

The procedure of Example 1 was repeated except that polymethyl methacrylate of 2.0 μm in thickness was employed alone as the matting agent. The evaluation was conducted in the same manner.

Although the suppression of the formation of bubbles and the anti-adhesion properties of the final product thus obtained were superior to those of Comparative Examples 1 to 5, the adhesion upon transfer of the product of this Comparative Example was inferior to that of Example 1.

EXAMPLE 6

The procedure of Example 1 was repeated except that particles of the following composition (particle size: 0.05 μm) were employed as the matting agent. The image-receiving sheet thus formed was evaluated in the same manner.

| | |
|---|---|
| Core: | |
| methyl methacrylate | 60 parts |
| allyl methacrylate | 14 parts |
| ethylene glycol dimethacrylate | 40 parts. |
| Shell: | |
| styrene | 12 parts |
| n-butyl methacrylate | 4 parts |
| methyl methacrylate | 4 parts. |

Similar to the above Examples, the product thus obtained showed no adhesion problems when placed on each other and stored. Further, no bubbles were formed upon transfer.

Compared with the products of Examples 2 and 3, the product of this Example showed an improved transferability and gave an excellent image.

While the invention has been described in detail and with reference to specific examples thereof, it will be apparent to one skilled in the art that various changes and modifications can be made therein without departing from the spirit and scope thereof.

What is claimed is:

1. An image-receiving sheet material which is used in a transfer image-formation process comprising: (A) transferring an image formed on an image-forming layer of a transferable and light-sensitive material onto an image-receiving sheet material, and then (B) retransferring said image from said image-receiving sheet material onto a permanent support, wherein said image-receiving sheet material comprises: (1) a support, and (2) provided thereon an image-receiving layer which comprises at least two layers each comprising a composition containing an organic high polymer, wherein at least one of at least two layers of said image-receiving layer is to be transferred onto the permanent support and which contains a matting agent comprising a composite three-dimensional resin particles prepared by a process comprising at least: (a) emulsion-polymerizing a polyfunctional monomer having at least two unsaturated groups differing in copolymerizabiity from each other with a polymerizable monomer containing a cross-linkable monomer capable of reacting with one of said at least two unsaturated groups of said polyfunctional monomer to obtain three-dimensional resin particles in which another of said at least two unsaturated groups of said polyfunctional monomer remains, and (b) forming a substantially linear polymer chain by graft-polymerizing at least one radical-polymerizable monomer capable of reacting with said another of said at least two unsaturated groups of said polyfunctional monomer.

2. An image-receiving sheet material as claimed in claim 1, wherein said polyfunctional monomer having at least two unsaturated groups differing in copolymerizability from each other is a compound having one or more monosubstituted ethylene bonds and/or 1,1-disubstituted ethylene bonds and one or more 1,2-disubstituted ethylene bonds and/or polysubstituted ethylene bonds.

3. An image-receiving sheet material as claimed in claim 1, wherein said polyfunctional monomer having at least two unsaturated groups differing in copolymerizability from each other is one or more compounds selected from the group consisting of allyl (meth)acrylate, an adduct of allyl glycidyl ether and (meth)acrylic acid, an adduct of monoallylamine or diallylamine and glycidyl (meth)acrylate or isocyanate having a (meth)acryloyl group, an adduct of allyl alcohol and isocyanate having a (meth)acryloyl group, an adduct of maleic acid or fumaric acid and glycidyl (meth)acrylate, an adduct of a monomaleate or monofumarate and glycidyl (meth)acrylate and an adduct of a fatty acid having an unsaturated group and glycidyl (meth)acrylate.

4. An image-receiving sheet material as claimed in claim 1, wherein the polymerizable monomer capable of reacting with one of the at least two unsaturated groups of said polyfunctional monomer is a combination of a compound having at least one α,β-ethylenic unsaturated bond not including polymerizable aromatic compounds with at least one compound selected from the group consisting of polymerizable unsaturated monocarboxylates of a polyhydric alcohol, polymerizable unsaturated alcohol esters of a polybasic acid and compounds having functional groups capable of reacting with each other.

5. An image-receiving sheet material as claimed in claim 1, wherein said matting agent has a particle size of from 0.005 to 20 μm.

6. An image-receiving sheet material as claimed in claim 1, wherein said matting agent has a particle size of from 0.01 to 10 μm.

7. An image-receiving sheet material as claimed in claim 1, wherein said matting agent comprises an organic high polymer having at least two layers comprising an internal layer and an external layer where the softening point of the internal layer is about 20° C. or above and that of the external layer is about 100° C. or below and the softening point of the internal layer is higher than that of the external layer at least by about 10° C.

8. A process for the formation of a transferred image comprising: (1) transferring an image formed on an image-forming layer made of a transferable and light-sensitive material onto an image-receiving sheet material of claim 1, and then (2) retransferring said image onto a permanent support.

* * * * *